(12) United States Patent
Clemens

(10) Patent No.: US 9,817,044 B2
(45) Date of Patent: Nov. 14, 2017

(54) DETERMINATION OF A SUBSTITUTE VALUE FOR THE PRIMARY-SIDE POWER CONSUMPTION OF A POWER SUPPLY UNIT

(71) Applicant: FUJITSU LIMITED, Kanagwa (JP)

(72) Inventor: Martin Clemens, Paderborn (DE)

(73) Assignee: FUJITSU LIMITED, Kawasaki (JP)

( * ) Notice: Subject to any disclaimer, the term of this patent is extended or adjusted under 35 U.S.C. 154(b) by 318 days.

(21) Appl. No.: 14/424,225

(22) PCT Filed: Jul. 18, 2013

(86) PCT No.: PCT/EP2013/065210
§ 371 (c)(1),
(2) Date: Feb. 26, 2015

(87) PCT Pub. No.: WO2014/032853
PCT Pub. Date: Mar. 6, 2014

(65) Prior Publication Data
US 2015/0226774 A1    Aug. 13, 2015

(30) Foreign Application Priority Data
Aug. 28, 2012   (DE) .......... 10 2012 107 916

(51) Int. Cl.
*G01R 21/00*       (2006.01)
*G01R 21/06*       (2006.01)
*G06F 1/28*        (2006.01)
*G01R 31/40*       (2014.01)

(52) U.S. Cl.
CPC .............. *G01R 21/00* (2013.01); *G06F 1/28* (2013.01); *G01R 31/40* (2013.01)

(58) Field of Classification Search
CPC ...... G01R 31/40; G01R 21/00; G01R 21/133; G06F 1/28
USPC ................................. 702/57, 60, 61
See application file for complete search history.

(56) References Cited

U.S. PATENT DOCUMENTS

| | | |
|---|---|---|
| 2008/0320322 A1 | 12/2008 | Green et al. |
| 2009/0174393 A1 | 7/2009 | Dishman et al. |
| 2009/0306914 A1 | 12/2009 | Cohen |
| 2011/0196544 A1 | 8/2011 | Baarman et al. |
| 2012/0071091 A1 | 3/2012 | Azancot et al. |
| 2012/0112735 A1 | 5/2012 | Tokunaga |

FOREIGN PATENT DOCUMENTS

| | | |
|---|---|---|
| JP | 2011-086174 A | 4/2011 |
| WO | 2009/100657 A1 | 8/2009 |

*Primary Examiner* — An Do
(74) *Attorney, Agent, or Firm* — Fujitsu Patent Center

(57) ABSTRACT

A method of determining a substitute value for a primary-side power consumption of a power supply unit includes recording a first measured value for a primary-side power consumption over a measurement period, repeatedly recording a second measured value for at least one secondary-side output power at first intervals of time, the first interval of time being shorter than the measurement period, determining an efficiency of the power supply unit on the basis of the first measured value and at least one second measured value, and calculating a substitute value for the primary-side power consumption on the basis of the efficiency determined in the determination step and at least one recorded second measured value.

14 Claims, 3 Drawing Sheets

DETERMINATION OF A SUBSTITUTE VALUE FOR THE PRIMARY-SIDE POWER CONSUMPTION OF A POWER SUPPLY UNIT

TECHNICAL FIELD

This disclosure relates to a method of determining a substitute value for a primary-side power consumption of a power supply unit, a computer system that carries out a method of determining a substitute value for a primary-side power consumption of a power supply unit, and a computer program product.

BACKGROUND

Computer systems are usually supplied by a power supply system which provides an AC voltage. Methods which, to determine the power consumption of the computer system, determine the power consumption of a power supply unit on the primary side of the power supply unit are generally known.

The problem of such an approach is that the supply voltage is an AC voltage. As a result, the power consumption cannot be easily determined by multiplying the current and voltage, but rather integration methods must be used. These methods must integrate over a particular period, with the result that data relating to the primary-side power consumption of the computer system can be transmitted to the computer system only at relatively large intervals of time.

Processors of a computer system can be restricted if it is determined that the power consumption of the computer system exceeds a certain limit value. As the operational reliability of the computer system becomes greater, the faster the computer system can react to fluctuations in the power consumption of the computer system.

It could accordingly be helpful to provide a method of determining the primary-side power consumption of a power supply unit, which method operates more quickly or more easily than known integration methods, in particular.

SUMMARY

I provide a method of determining a substitute value for a primary-side power consumption of a power supply unit, including recording a first measured value for a primary-side power consumption over a measurement period, repeatedly recording a second measured value for at least one secondary-side output power at first intervals of time, the first interval of time being shorter than the measurement period, determining an efficiency of the power supply unit on the basis of the first measured value and at least one second measured value, and calculating a substitute value for the primary-side power consumption on the basis of the efficiency determined in the determination step and at least one recorded second measured value.

I also provide a computer system including at least one power supply unit and a microcontroller, the microcontroller carrying out the method of determining a substitute value for a primary-side power consumption of a power supply unit, including recording a first measured value for a primary-side power consumption over a measurement period, repeatedly recording a second measured value for at least one secondary-side output power at first intervals of time, the first interval of time being shorter than the measurement period, determining an efficiency of the power supply unit on the basis of the first measured value and at least one second measured value, and calculating a substitute value for the primary-side power consumption on the basis of the efficiency determined in the determination step and at least one recorded second measured value.

I further provide a computer program product including executable program code executing the method of determining a substitute value for a primary-side power consumption of a power supply unit, including recording a first measured value for a primary-side power consumption over a measurement period, repeatedly recording a second measured value for at least one secondary-side output power at first intervals of time, the first interval of time being shorter than the measurement period, determining an efficiency of the power supply unit on the basis of the first measured value and at least one second measured value, and calculating a substitute value for the primary-side power consumption on the basis of the efficiency determined in the determination step and at least one recorded second measured value when the executable program code is being executed by a data processing apparatus of a computer system.

LIST OF REFERENCE SYMBOLS

Figure 1:
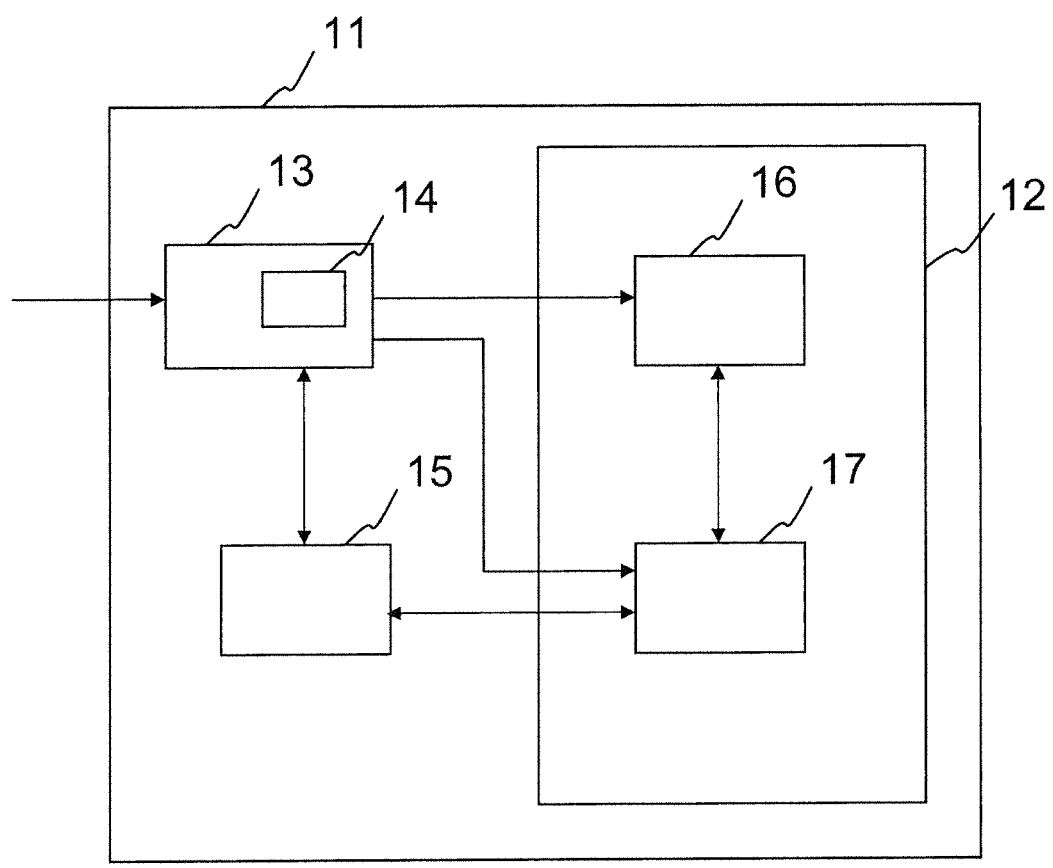
FIG. 1 shows an example of my computer system.

11 Computer system
12 System component
13 Power supply unit
14 Fan
15 Microcontroller
16 Processor
17 System management component
21-24 Method steps
A-E Graphs of different variables

DETAILED DESCRIPTION

I provide a method for a computer system which, to determine a substitute value for the primary-side power consumption of the power supply unit of the computer system, can use measured values of the secondary-side output power of the power supply unit and the efficiency of the power supply unit. The steps of the method comprise in this case:

recording a first measured value for a primary-side power consumption over a measurement period;
repeatedly recording a second measured value for at least one secondary-side output power at first intervals of time, the first interval of time being shorter than the measurement period;
determining an efficiency of the power supply unit on the basis of the first measured value and at least one second measured value; and
calculating a substitute value for the primary-side power consumption on the basis of the efficiency determined in the determination step and at least one recorded second measured value.

When recording a first measured value, the power consumption on the mains side of the power supply unit is determined over a certain period, for example, by integration. The output power of the power supply unit is determined on the secondary side of the power supply unit at typically considerably shorter intervals of time. This is possible since the power supply unit generally outputs a DC voltage which can be easily measured and can be used to determine an output power, for example, by being multiplied by the output current. An efficiency can now be determined for the power supply unit from the first measured value recorded on the primary side and at least one second measured value recorded on the secondary side, which efficiency is valid to a good approximation for the current measurement period and for one or more subsequent measurement periods for the purpose of determining the first measured value. This efficiency of the power supply unit can now be used, for example, in a next measurement period, at each time at which a value of the secondary-side output power is available, to calculate a substitute value for the primary-side power consumption of the power supply unit.

One advantage of this method is that values for the power consumption of the power supply unit are more frequently available during a subsequent integration phase to determine the primary-side power consumption of the power supply unit than would be possible taking into account only the primary-side first measured values.

Advantageously, the efficiency may be determined from at least one primary-side first measured value and a mean value of a plurality of secondary-side second measured values. Determining a mean value of the efficiency from a mean value of a plurality of secondary-side second measured values and at least one primary-side first measured value makes it possible to determine more exact values for the efficiency. It is likewise possible to determine a mean value of the efficiency of the power supply unit by determining a plurality of values for the efficiency and only then determining a mean value from the individual values for the efficiency.

Advantageously, the mean values of the efficiency of the power supply unit may be averaged a further time. A period corresponding to a multiple of the measurement period is taken into account. One advantage is that it is possible to predict the values in a more stable manner again.

The step of calculating the substitute values for the primary-side power consumption of the power supply unit may be carried out periodically at intervals of time, the interval of time being shorter than the measurement period. This variant of the method makes it possible to frequently provide the computer system with values for the primary-side power consumption.

Not only are the primary-side and secondary-side power levels taken into account, but also, inter alia, the input voltage, the power consumption of a fan present in the power supply unit, as determined by the fan speed, and the load range of the power supply unit, to determine the efficiency of the power supply unit. The input voltage may have different values, and the fan speed and the load range of the power supply unit may fluctuate and influence the efficiency of the power supply unit. This refinement of the method makes it possible to provide more precise substitute values.

I also provide a computer system comprising a power supply unit and a microcontroller, the microcontroller being set up to record measured values for the at least one secondary-side output power of the power supply unit at shorter intervals of time than the primary-side measured values. The microcontroller determines the efficiency of the power supply unit from at least these measured values and the values of the primary-side power consumption and then calculates a substitute value for the primary-side power consumption of the power supply unit from the measured values of the at least one secondary-side output power of the power supply unit and the efficiency. Such a computer system is advantageous in so far as it determines substitute values for the primary-side power consumption at considerably shorter intervals of time than conventional computer systems.

The microcontroller may be arranged in the power supply unit of the computer system. For example, it is possible to use an already existing microcontroller and to dispense with the additional effort caused by installing a separate microcontroller.

The microcontroller may be part of a system management component which is arranged on a motherboard. This has the advantage that a microcontroller already provided for the purpose of managing the computer system can be used, which microcontroller controls the power levels of the processor and therefore limits the power consumption of the entire computer system.

The microcontroller may be part of a chipset of the computer system. It is possible to dispense with installing additional components by using a microcontroller of the chipset of the computer system, which chipset is generally present anyway.

Different examples are described below with reference to the attached figures.

FIG. 1 shows a block diagram of a computer system 11 in which a system component 12, in particular a motherboard, is arranged and supplied with different operating voltages, inter alia for individual components of the system component 12, by a power supply unit 13. Possible components of the system component 12 are, for example, a processor 16 or a system management component 17. The power supply unit 13 receives a mains AC voltage to supply the computer system 11 on the primary side and outputs one or more different secondary DC voltages again on the secondary side. To avoid overheating of the power supply unit 13, a fan 14 is arranged in the power supply unit 13 in the example.

The computer system 11 also has a microcontroller 15. The microcontroller 15 determines the relevant secondary-side output power levels of the power supply unit 13. In addition, the microcontroller 15 calculates an efficiency of the power supply unit 13. As explained further with reference to FIGS. 2 and 3, the microcontroller 15 can then calculate values for the primary-side power consumption of the computer system 11 from these values at very short intervals of time.

The computer system 11 may be arranged such that the microcontroller 15 forwards the calculated substitute values for the primary-side power consumption of the power supply unit 13 to the system management component 17. The system management component 17 can use the received information from the microcontroller 15 to influence the computer system 11 such that it reduces the power consumption of the processor 16, which reduces the primary-side power consumption of the power supply unit 13.

Advantageously (not illustrated), the microcontroller 15 may be part of the system management component 17. This system management component 17 can be arranged on the motherboard. The system management component 17 may be in the form of a system management module (Baseboard Management Controller, BMC) which comprises, inter alia, a microcontroller and provides remote maintenance functions via a network interface and influences, inter alia, hardware components, for example, a processor, via a system management bus. The BMC can therefore control, inter alia, the processor power and can therefore change the power consumption of the processor. This can be effected, for example, by applying a so-called PROCHOT# signal which initiates a power-saving mode inside the processor.

The microcontroller used to determine the power consumption (not illustrated) can also be arranged in the power supply unit 13 of the computer system 11. The advantage of such an arrangement is that a microcontroller which is already installed in the power supply unit 13 and is used, for example, to control a switching converter installed therein can be used for the purpose of carrying out the method.

It is also possible (not illustrated) for the microcontroller 15 to be part of a chipset of the computer system 11.

Figure 2:
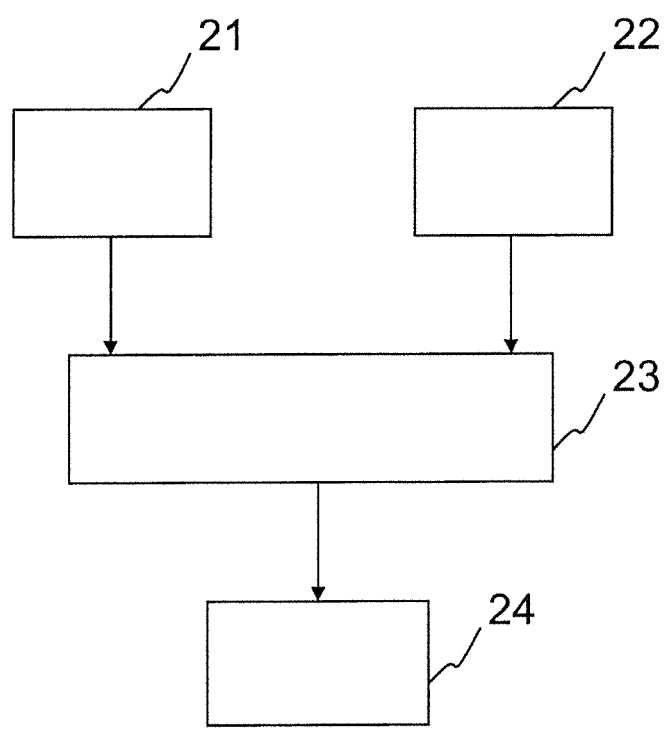
FIG. 2 shows a flowchart of a method according to an example of the system.

FIG. 2 shows a possible flowchart of a method of determining a substitute value for a primary-side power consumption of the power supply unit 13.

In a first step 21, the primary-side power consumption of the power supply unit 13 is measured. Since this is a mains AC voltage, the power consumption of the power supply is not simply determined by multiplying the voltage and current but rather by using an integration method which is known per se, for example. This method requires a comparatively long period. The computer system 11 is therefore provided with a new measured value of the primary-side power consumption only every second, for example. This is unsatisfactory in so far as the computer system 11 sometimes must react considerably more quickly to high power peaks.

Irrespective of this, the secondary-side output power of the power supply unit 13 is measured more quickly in step 22. Since the power supply unit 13 provides a direct current or a DC voltage, it is possible here to easily determine the power as the product of the current and voltage. This is carried out at considerably shorter intervals of time than it is possible to provide the measured values in step 21, for example, every 0.05 second.

An efficiency of the power supply unit 13 is determined in step 23. For this purpose, the at least one recorded measured value from step 22 is related to the at least one measured value from step 21.

This efficiency can now be used in step 24 to determine a substitute value for the primary-side power consumption of the power supply unit 13 for each further value of the secondary output power. Since the efficiency of the power supply unit 13 changes more slowly than the power consumption of the computer system 11, the computer system 11 can be provided with values for the primary-side power consumption more quickly and at shorter intervals of time.

Not only a value for the efficiency, but rather a mean value of the efficiency, may be used to calculate the primary-side power consumption. For this purpose, a selection of recorded measured values or all recorded measured values from step 22 which are correlated in terms of time with the at least one measured value measured in step 21, for example, from the same measurement period, is/are related to the at least one measured value from step 21.

Forming a mean value of the different values of the efficiency or forming a mean value of the different measured values recorded in step 22 and then forming the efficiency makes it possible to determine more accurate values for the efficiency.

Not only is a mean value of the efficiency over a measurement period used to calculate the primary-side power consumption, but rather the efficiency over a longer period, for example, five measurement periods, may be formed from the individual mean values over each individual measurement period.

Forming a mean value of the different preceding mean values makes it possible to further increase the accuracy of the method since brief power fluctuations have a smaller influence. This is important in so far as the measured values of the primary-side power consumption which are made available to the computer system 11 can be provided at longer intervals of time than the actual measurement lasts, for example, as a result of an integration method. As a result, the measured values are, under certain circumstances, not representative of this measurement period since they have been recorded in a period which is not exactly defined inside the measurement period.

Not only are the measured values for the primary-side power consumption which are determined in step 21 and the measured values for the secondary-side output power of the power supply unit 13 which are determined in step 22 used in step 23 to determine the efficiency of the power supply unit 13, but rather a further number of factors which may have an effect on the efficiency of the power supply unit 13 may be taken into account.

Efficiency of power supply units depends, inter alia, on their load range. A power supply unit can be expected to be operated in a particularly favorable manner in a load range of 50% to 90% of the maximum output power. The characteristics of power supply units are known and can therefore be taken into account when calculating a method.

The primary-side input voltage may have different values depending on the region in which the computer system 11 is operated. Mains voltages of 120 V or 235 V are conventional, for example. One example of the method takes into account the primary-side input voltage when calculating the efficiency of the power supply unit 13 and can therefore provide improved substitute values for the primary-side power consumption of the power supply unit 13.

Thus, a fan 14 may be integrated in the power supply unit 13 as an internal power consumer. The power consumption of the fan 14 varies depending on its speed. The speed of the fan 14 depends on the temperature. Since the temperature does not change abruptly, the power consumption of the fan 14 cannot be expected to change abruptly. Changes in the power consumption of the fan 14 can therefore be taken into account in the values of the efficiency of the power supply unit 13 using the method.

The power supply unit 13 provides different components of the computer system 11 with different operating power levels. The practice of measuring those operating power levels which are subjected to frequent changes is advantageous to calculate the total secondary output power of the power supply unit 13. Float voltages which supply components, for example, those for system management, do not need to be measured when recording the secondary output power, for example, since they have very uniform, low or known values.

Figure 3:
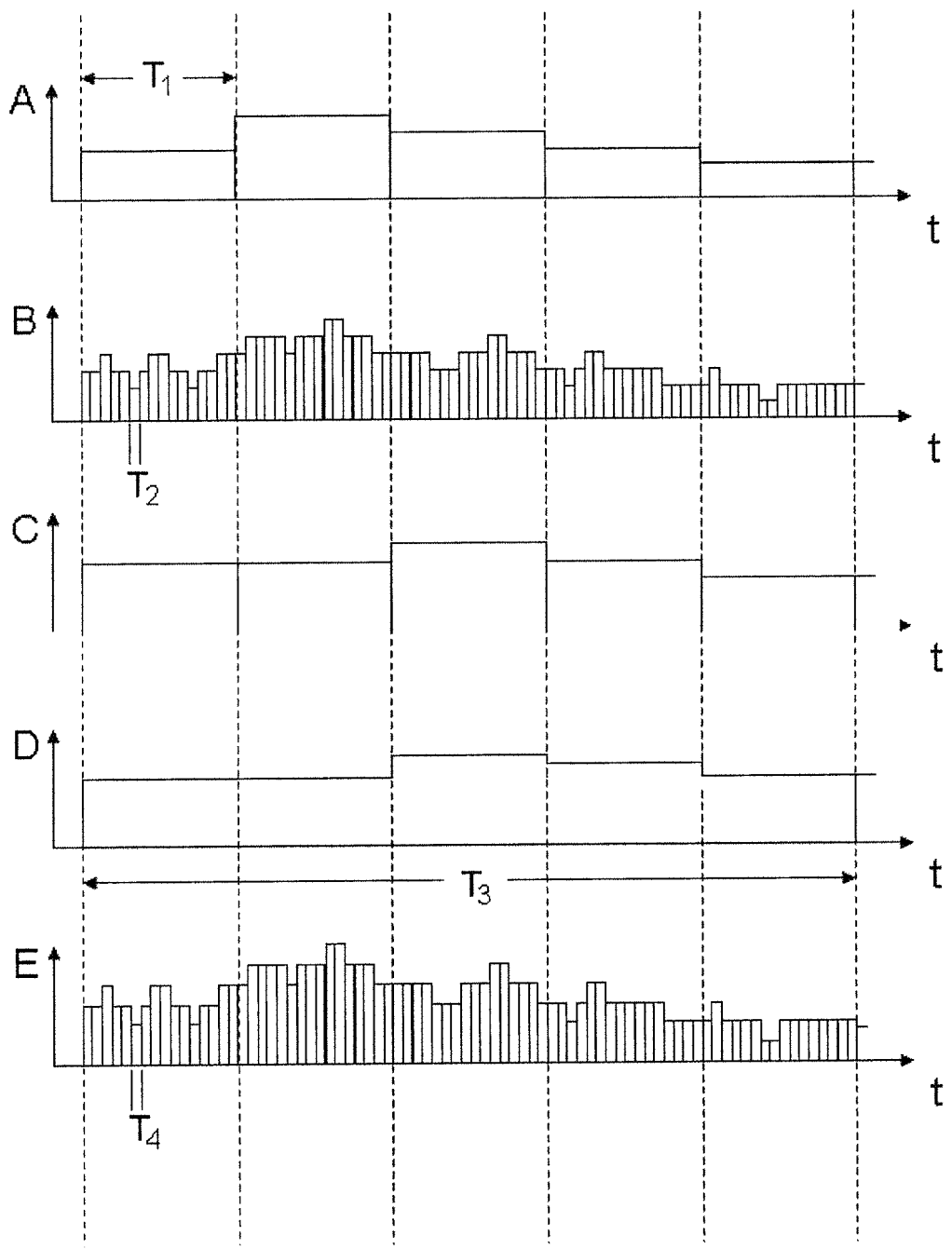
FIG. 3 shows graphs showing five different variables.

FIG. 3 shows the temporal profile of five different variables. Graph A shows the values for the primary-side power consumption of the power supply unit 13 which are determined using an integration method according to step 21. These values change only once per measurement period $T_1$.

Graph B shows the power output of the power supply unit 13 which is temporally correlated therewith, is recorded in step 22 and is measured on the secondary side. These values are determined at shorter intervals of time $T_2$.

Graph C illustrates the determined efficiency of the power supply unit 13 on the basis of the two variables illustrated in graphs A and B. It is clear that the efficiency values are each determined for a measurement period $T_1$ as illustrated in graph A.

Graph D shows a mean value of the efficiency of the power supply unit 13 which is formed over a longer period $T_3$, for example, the last five mean values illustrated according to graph C. The mean value is recalculated in each case with a new primary-side measured value (graph A).

Graph E illustrates a determined substitute value for the primary-side power consumption of the power supply unit 13. The substitute value is calculated with the aid of the efficiency of the power supply unit 13 and the measured values of the secondary power output. As illustrated in graph E, the interaction of the efficiency and the number of second measured values measured on the secondary side, which is more frequent compared to the first measured values measured on the primary side, makes it possible to provide a substitute value for the primary-side power consumption of the power supply unit 13 after a period $T_4$ in each case. In graph E, the period $T_4$ is identical to the period $T_2$. It goes without saying that the periods $T_2$ and $T_4$ may likewise be different.

Increasing the frequency of the substitute values output compared to the primary measurement period $T_1$ makes it possible to increase the control accuracy of a downstream algorithm for calculating the power consumption of a computer system with substantially the same measurement effort. Conversely, a predefined control accuracy can be retained with simultaneous refinement of the measurement.

The different features mentioned above can be combined in various ways to achieve the advantages mentioned in each case.

The invention claimed is:

1. A method of determining a substitute value for a primary-side power consumption of a power supply unit of a computer system, comprising:
   recording, by a microcontroller, a first measured value for a primary-side power consumption of the power supply unit over a measurement period;
   repeatedly recording, by the microcontroller, a second measured value for at least one secondary-side output power of the power supply unit at first intervals of time, the first interval of time being shorter than the measurement period;
   calculating, by the microcontroller, an efficiency of the power supply unit on the basis of the first measured value and at least one second measured value; and
   calculating, by the microcontroller, a substitute value for the primary-side power consumption on the basis of the efficiency calculated in the efficiency calculating step and at least one recorded second measured value such that the computer system can react faster to fluctuations in power consumption of the computer system.

2. The method according to claim 1, wherein calculating the efficiency is based on at least one first mean value of a plurality of second measured values correlated with the first measured value in terms of time and on the first measured value.

3. The method according to claim 2, wherein a second mean value of a plurality of first mean values, which is formed over a multiple of the measurement period, is used to calculate the substitute value for the primary-side power consumption.

4. The method according to claim 1, wherein calculating the substitute value for the primary-side power consumption is carried out periodically at second intervals of time, the second interval of time to calculate the substitute value for the primary-side power consumption being shorter than the measurement period.

5. The method according to claim 1, wherein calculating the efficiency is based on at least one of the following variables: primary-side input voltage, fan speed of at least one fan and load range of the power supply unit.

6. A non-transitory computer program product comprising executable program code executes the method according to claim 1 when the executable program code is being executed by a data processing apparatus of a computer system.

7. The method according to claim 1, wherein a power consumption of a processor of the computer system is reduced if it is determined that the power consumption of the computer system exceeds a certain limit value.

8. The method according to claim 1, wherein the power supply unit receives a main AC voltage on the primary-side and outputs at least one secondary DC voltage on a secondary-side.

9. A computer system comprising:
   at least one power supply unit; and
   a microcontroller, the microcontroller configured to:
   record a first measured value for a primary-side power consumption of the at least one power supply unit over a measurement period;
   repeatedly record a second measured value for at least one secondary-side output power of the at least one power supply unit at first intervals of time, the first intervals of time being shorter than the measurement period;
   calculate an efficiency of the at least one power supply unit of the basis of the first measured value and at least one second measured value; and
   calculate a substitute value for the primary-side power consumption on the basis of the efficiency calculated in the efficiency calculation step and at least one recorded second measured value such that the computer system can react faster to fluctuations in power consumption of the computer system.

10. The computer system according to claim 9, wherein the microcontroller is arranged in a power supply unit of the computer system.

11. The computer system according to claim 9, wherein the microcontroller is part of a system management component.

12. The computer system according to claim 9, wherein the microcontroller is part of a chipset of the computer system.

13. The computer system according to claim 9, wherein the computer system is arranged to reduce a power consumption of a processor of the computer system if it is determined that the power consumption of the computer system exceeds a certain limit value.

14. The computer system according to claim 9, wherein the at least one power supply unit is arranged to receive a main AC voltage on the primary-side and to output at least one secondary DC voltage on a secondary-side.

* * * * *